United States Patent
Lee

(10) Patent No.: US 10,063,146 B1
(45) Date of Patent: Aug. 28, 2018

(54) FULL-TIME INDUCTOR CURRENT MONITORING METHOD BY SENSING LOW SIDE SWITCH

(71) Applicant: Alpha and Omega Semiconductor (Cayman) Ltd., Grand Cayman (KY)

(72) Inventor: Gilbert S. Z. Lee, Saratoga, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 0 days.

(21) Appl. No.: 15/476,790

(22) Filed: Mar. 31, 2017

(51) Int. Cl.
| | |
|---|---|
| *G01R 1/20* | (2006.01) |
| *H02M 3/158* | (2006.01) |
| *H02M 1/08* | (2006.01) |
| *G01R 15/18* | (2006.01) |
| *G01R 19/00* | (2006.01) |
| *H02M 1/00* | (2006.01) |

(52) U.S. Cl.
CPC ............ *H02M 3/158* (2013.01); *G01R 15/18* (2013.01); *G01R 19/003* (2013.01); *H02M 1/08* (2013.01); *H02M 2001/0009* (2013.01)

(58) Field of Classification Search
CPC .................. H02M 3/158; H02M 1/08; H02M 2001/0009; G01R 19/003; G01R 15/18; G01R 1/203; G01R 15/146; G01R 19/0007
See application file for complete search history.

(56) References Cited

U.S. PATENT DOCUMENTS

| | | |
|---|---|---|
| 9,106,075 B2 | 8/2015 | Tomas et al. |
| 9,491,014 B1 | 11/2016 | Lee |
| 2012/0139518 A1* | 6/2012 | Cleveland ............ H02M 3/157 323/283 |

(Continued)

OTHER PUBLICATIONS

Co-Pending U.S. Appl. No. 15/425,163, to Zhiye Zhang, filed Feb. 26, 2017.

*Primary Examiner* — Tung X Nguyen
(74) *Attorney, Agent, or Firm* — JDI Patent; Joshua Isenberg; Robert Pullman

(57) ABSTRACT

Aspects of the present disclosure describe a SMPS system, comprising a SMPS and an inductor current sensing device. The SMPS comprise a high-side (HS) switch and a low-side (LS) switch coupled in series and an output filter including an inductor and a capacitor coupled to a switch node formed by the HS and LS switches. An inductor current is supplied by the inductor to a load. The inductor current sensing device coupled across the LS switch has a first input configured to receive a node signal indicating a voltage level at the switch node, a second input configured to receive an input voltage of the system and a third input configured to receive an output voltage of the system. The inductor current sensing device is configured to obtain a first constant DC slope information, a second constant DC slope information and a valley current information based on the first input, second and third inputs, and generate an output signal based on the first constant DC slope information, the second constant DC slope information and the valley current information. The output signal has a triangular waveform including a rising slope and a falling slope proportional to rising and falling slopes of the inductor current.

34 Claims, 10 Drawing Sheets

(56) References Cited

U.S. PATENT DOCUMENTS

| | | | |
|---|---|---|---|
| 2012/0235652 A1* | 9/2012 | Sheng | H02M 3/156 323/271 |
| 2015/0255930 A1 | 9/2015 | Lee | |
| 2016/0049876 A1 | 2/2016 | Lee et al. | |
| 2016/0109488 A1* | 4/2016 | Dearborn | H02M 3/156 324/76.11 |
| 2016/0259390 A1 | 9/2016 | Tomas et al. | |

* cited by examiner

US 10,063,146 B1

FULL-TIME INDUCTOR CURRENT MONITORING METHOD BY SENSING LOW SIDE SWITCH

FIELD OF THE DISCLOSURE

This disclosure relates to integrated circuits and more specifically current sensing devices in a Switch Mode Power Supply (SMPS).

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. In one application, MOSFETs have been widely employed in Switching Mode Power Supplies (SMPS) because they are power efficient and thermally efficient. In addition to MOSFET switches, a SMPS also comprises energy saving devices, such as inductors or capacitors.

A power supply is a key element in any electronic device and its performance can affect power efficiency, product safety and product performance. Thus, it is necessary for a power supply (e.g., an SMPS) to include a power monitoring system to monitor and/or regulate its output. Power regulation usually includes output voltage or current feedback. Since many SMPS systems (i.e., SMPS including power monitoring or regulation features) use current mode regulation, it is a critical for such systems to obtain accurate current information.

Recent computing applications demand SMPS systems to run at higher frequency to increase bandwidth. These applications also require SMPS systems to have a smaller form factor and reduced cost. SMPS systems manufacturers have responded to these requirements by using small inductors and capacitors. In addition, there is a trending to lower the operating voltage for SMPS systems (e.g., step-down DC-DC converters) so as to achieve higher speed operation and better power savings. As such, the voltage ratio ($V_{IN}/V_{OUT}$) between the input voltage and output voltage increases and the energy saving period (i.e. on-time duty D) becomes shorter. It is a challenge in such systems to accurately sense current information due to the high switching frequency, the short on-time duty and the noise made from switches turning-on and off.

It is within this context that aspects of the present disclosure arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

In the following description, the variables in connection with the signals, such as $V_{IN}$, $V_{OUT}$, $i_L$, are used or referred to. It is noted that a large signal is a DC signal (or an AC signal at a point in time) that is one or more orders of magnitude larger than the small signal and is used to analyze a circuit containing non-linear components and calculate an operating point (bias) of these components. Large-signal DC quantities are denoted by uppercase letters with uppercase subscripts. Small-signal quantities are denoted using lowercase letters with lowercase subscripts. An example of a small signal is an AC signal superimposed on a circuit containing a large signal. Total quantities, combining both small-signal and large-signal quantities, are denoted using lower case letters and uppercase subscripts.

INTRODUCTION

As discussed earlier, accurate current monitoring is critical in current mode operation systems because the systems need current information for power regulation. Several designs have been proposed for inductor current sensing/monitoring in a SMPS to monitor its current information.

Figure 1A:
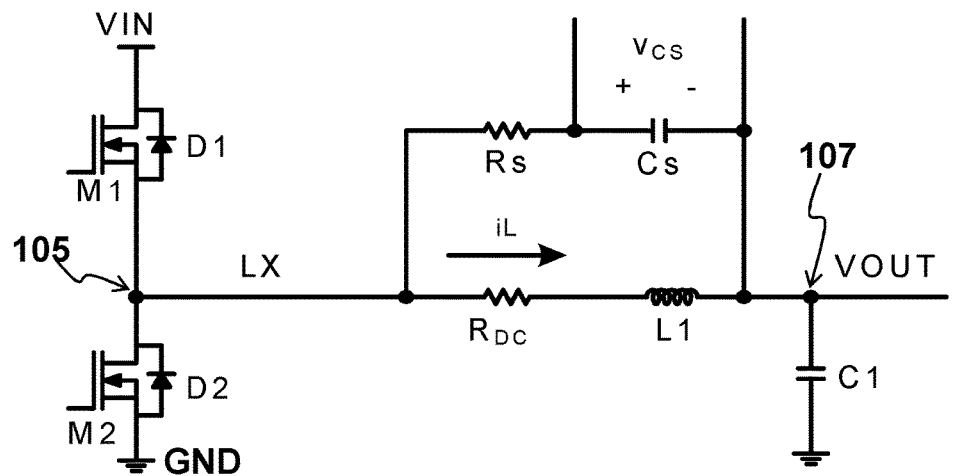
FIG. 1(a) is a schematic diagram illustrating a conventional SMPS with inductor current sensing device.

FIG. 1(a) shows a conventional SMPS with a current sensing device. The SMPS system 100 is a step-down DC-DC converter, which includes power switching elements (M1-D1, M2-D2) coupled in series across the input voltage source. Power switching element (M1-D1) is coupled to the voltage supply ($V_{IN}$) and power switching element (M2-D2) is connected to ground (GND). Power switching element (M1-D1) is also referred to as a high-side (HS) switch and power switching element (M2-D2) as a low-side (LS) switch. An output filter including an inductor (L1) and a capacitor (C1) are connected to a junction 105 (i.e., phase node or switch node) formed by the pair of HS and LS switches for providing an output voltage ($V_{OUT}$) to a load. Inductor L1 has a parasitic DC resistance $R_{DC}$. Through the HS and LS switches, the output inductor L1 is alternately switched with one side to input voltage $V_{IN}$ and a ground level GND. The output voltage $V_{OUT}$ can thus be generated to lower than the input voltage level $V_{IN}$ by controlling the ON and OFF actions of the HS and LS switches via a controller (not shown). The controller turns the HS and LS switches on and off at a switching frequency fsw. The output voltage $V_{OUT}$ is buffered on the capacitor C1. A load (not shown) may be coupled to output node 107, and a current $I_L$ can be supplied by the inductor L1 to the load. For a current mode operation system, it has to acquire or sense the inductor current $i_L$ for power regulation.

Figure 1B:
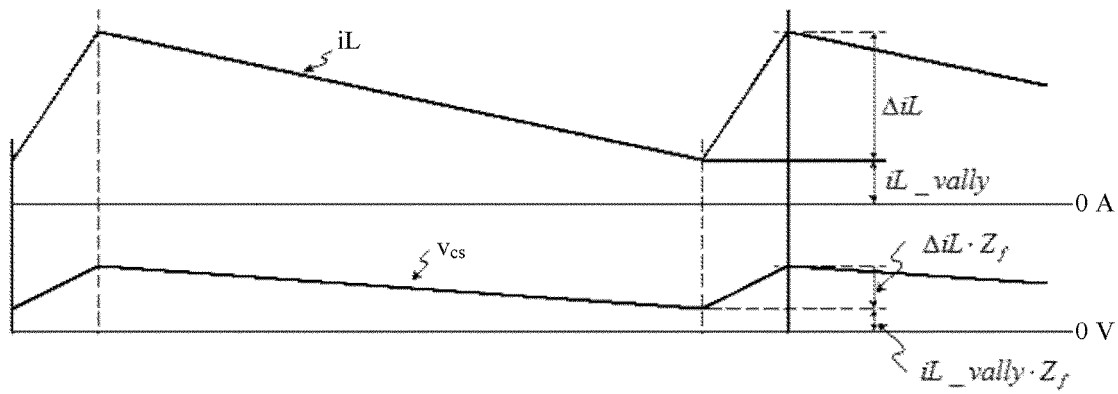
FIG. 1(b) is a graph depicting signal waveforms in the SMPS of FIG. 1(a).

With respect to inductor current sensing, the system 100 has a low-pass RC sensing device. The low-pass RC sensing device includes a resistor Rs in series with a capacitor Cs. The RC sensing device is placed in parallel with inductor L1 having a parasitic DC resistance $R_{DC}$. The RC sensing device filters the voltage across the inductor L1 and senses the current through the parasitic DC resistance $R_{DC}$ of the inductor L1. Conventionally, the induced voltage $V_{CS}$ across the capacitor Cs is reported as the sensed output voltage. As shown in FIG. 1(b), the waveform of the induced voltage $v_{CS}$ follows the waveform of the inductor current $I_L$. Thus, current sensing for the inductor ($i_L$) can be achieved by acquiring the induced voltage $v_{CS}$.

Normally for a DC-DC converter to have good performance, the time constant (L1/$R_{DC}$) of the inductor L1 should be much longer than the switching period (1/fsw). In addition, the time constant of the low-pass RC sensing device (Rs/Cs) needs to be the same as the time constant of the inductor L1 for accurate sensing as Equation (1) shown below.

$$Rs \cdot Cs = \frac{L1}{R_{DC}} \gg \frac{1}{fsw} \quad (1)$$

The above RC sensing method however suffers some disadvantages. First, the system suffers from either poor accuracy or power loss due to parasitic resistance $R_{DC}$ of the inductor L1. According to Equation (1), the parasitic resistance $R_{DC}$ should be small in order to operate in the high frequency. A smaller parasitic resistance $R_{DC}$ also helps reduce the power loss and benefit the energy efficiency. However, when the parasitic resistance $R_{DC}$ is small, its voltage ripple is also small and it becomes hard to recognize the drop-off information. That is, the induced voltage $v_{CS}$ across the capacitor Cs is too small to recognize. This issue is worse under a light load condition where the current is very small. While a large parasitic resistance $R_{DC}$ helps recognize the drop-off information and sense the current slope accurately, it causes large power loss.

In addition, the components used in the conventional RC sensing method are temperature sensitive. Replacement of these components may increase the cost and still cannot guarantee the accuracy under the light load condition. Moreover, the value of the parasitic resistance $R_{DC}$ has a distribution. Since it is not possible to measure the parasitic resistance $R_{DC}$, there is no way to compensate it. Thus, the inductor current information acquired based on the parasitic resistance $R_{DC}$ cannot be accurate.

Inductor Current Sensing Device/Method

Aspects of the present disclosure provide an inductor current sensing device and/or method for a SMPS system configured to acquire inductor current by only sensing information of the low-side (LS) switch. According to aspects of the present disclosure, the inductor current sensing information is classified into rising and falling current slope information and average current information. Here the "average current" means the DC value of the inductor current. In FIG. 1(b) shows the inductor current waveform, which is composed of a DC (average) component and an AC(triangular) characterized by a maximum current iL_peak and a minimum current iL_valley. In such a case, the average current is given by iL(average)=iL_valley+ΔiL/2, where ΔiL=iL_peak−iL_valley. The information is sensed and processed separately and merged into one output signal to report to the controller for regulation. The sensing method according to aspects of the present disclosure may well be implemented by the controller IC, driver IC or stand-alone devices depending on the applications.

According to aspects of the present disclosure, a SMPS system comprises a SMPS and an inductor current sensing device. The SMPS includes a high side switch and a low side switch coupled in series and an output filter including an inductor and a capacitor coupled to a switch node formed by the HS and LS switches. An inductor current is supplied by the inductor to a load. The inductor current sensing device coupled across the LS switch has a first input configured to receive a node signal indicating a voltage level at the switch node, a second input configured to receive an input voltage of the system and a third input configured to receive an output voltage of the system. The inductor current sensing device is configured to obtain a first constant DC slope information, a second constant DC slope information and a valley current information based on the first input, second and third inputs, and generate an output signal based on the first constant DC slope information, the second constant DC slope information and the valley current information. The output signal has a triangular waveform including a rising slope and a falling slope proportional to rising and falling slopes of the inductor current.

Figure 2:
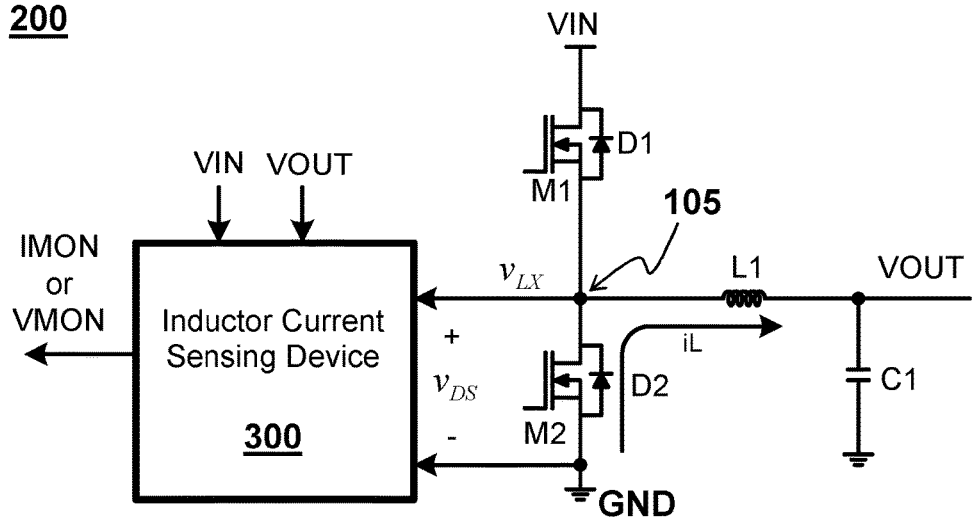
FIG. 2 is a schematic diagram illustrating a SMPS system with an inductor current sensing device according to aspects of the present disclosure.

FIG. 2 shows an overview of a SMPS system with an inductor current sensing device according to aspects of the present disclosure. In this embodiment, the SMPS system 200 includes a step-down DC-DC converter and an inductor current sensing device 300 coupled to the converter. In other embodiments, the power supply in the SMPS system 200 may be a step-up DC-DC converter, a step-down and step-up DC-DC converter or any other SMPS. Similar to FIG. 1(a), the DC-DC converter in the SMPS system of FIG. 2 includes power switching elements (M1-D1, M2-D2) coupled in series across the input voltage source. Power switching element (M1-D1) is coupled to the voltage supply ($V_{IN}$) and power switching element (M2-D2) is connected to ground (GND). Power switching element (M1-D1) is also referred to as high-side (HS) switch and power switching element (M2-D2) as low-side (LS) switch. An output filter including an inductor (L1) and a capacitor (C1) is connected to a junction 105 (i.e., phase node or switch node) formed by the pair of the HS and LS switches for providing an output voltage ($V_{OUT}$) to a load. The output voltage $V_{OUT}$ is buffered on the capacitor C1. A load (not shown) may be coupled to output node 107, and a current $I_L$ can be supplied by the inductor L1 to the load.

The HS and LS switches are controlled by a Pulse Width Modulation (PWM) signal generated from a controller (not shown). In one embodiment, the HS switch is controlled by a PWM signal, and the LS switch is controlled by a complementary pattern of the PWM signal or a NOT signal of the PWM signal. Thus, when the PWM signal is in a first logic state (e.g., a HIGH logic signal) and the NOT signal of the PWM signal is LOW, the HS switch is turned on (i.e., MOSFET M1 is turned on) and the LS switch is turned off (i.e., MOSFET M2 is turned off). At this time, current flows from the input node through HS switch to the inductor L1. An inductor current $i_L$ which flows through inductor L1 equals a HS current $i_{HS}$ which flows through the HS switch. When the PWM signal is in a second logic state (e.g., in logic LOW), NOT signal of the PWM signal is in logic HIGH, the HS switch is turned off (i.e., MOSFET M1 is turned off) and the LS switch is turned on (i.e., MOSFET M2 is turned on). As shown in FIG. 2, current flows from the ground through the LS switch to the inductor L1. During this time period, inductor current $i_L$ equals the LS current $i_{LS}$ which flows through the LS switch (M2 or D2). While it is possible, it is very difficult to sense HS current information due to the short turn-on time of the HS switch. Aspects of the present disclosure describe a method of sensing inductor current by sensing only the information of the LS switch. As such, when the HS switch is on and the LS switch is off, the HS current information that equals to the inductor current can be generated or emulated based on the sensed information of the LS switch. When the HS switch is off and the LS switch is on, the inductor current is the sensed current information of the LS switch.

In order to sense the LS current information (i.e., the source-to-drain current of the MOSFET M2), the drain-to-source voltage $v_{HS}$ and the turn-on resistance $R_{DS\_ON}$ of the MOSFET M2 are first acquired. The -drain-to-source voltage $v_{HS}$ of the MOSFET M2 equals the dropout voltage by the inductor current $I_L$. Therefore, the drain-to-source voltage $v_{HS}$ includes current information of the inductor L1. As shown in FIG. 2, the inductor current sensing device 300 is coupled across the source and drain of the LS switch to receive the drain-to-source voltage $v_{HS}$ as one of the inputs to the sensing device 300. In one embodiment, the drain-to-source voltage $v_{HS}$ can be obtained from the voltage $v_{LX}$ because voltage $v_{HS}$ equals the difference between voltage $v_{LX}$ and ground GND. In addition, information of the input and output voltage ($V_{IN}$ and $V_{OUT}$) are also supplied to the sensing device 300. In one embodiment, information of the output voltage $V_{OUT}$ can be replaced with the filtered (or averaged) voltage $v_{LX}$ because the filtered voltage $v_{LX}$ is almost the same as the output voltage $V_{OUT}$.

Figure 3:
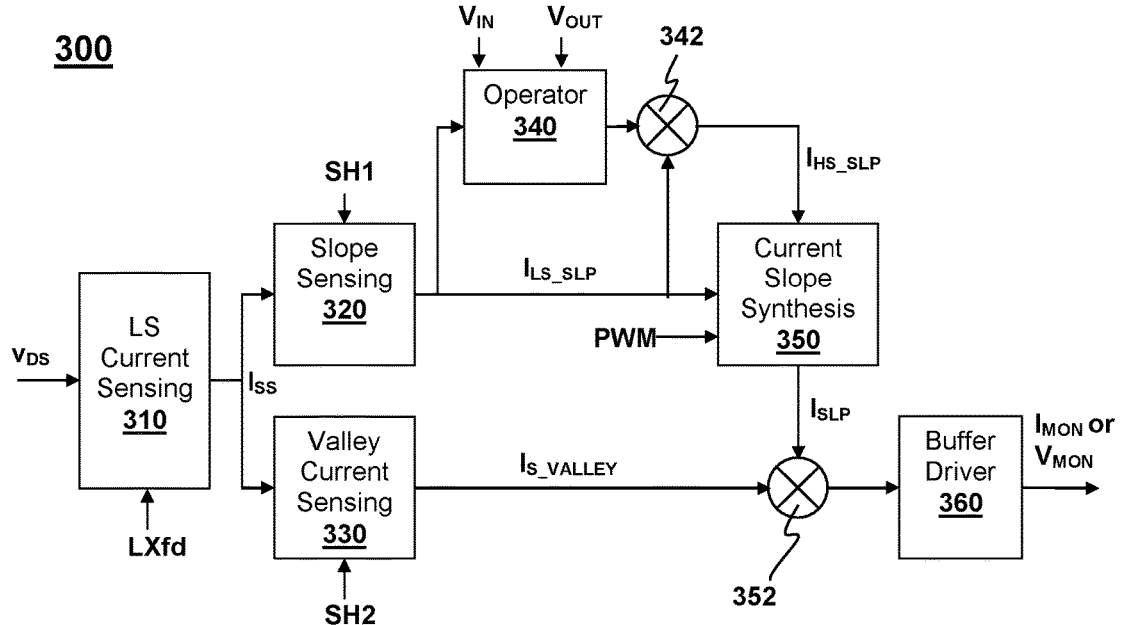
FIG. 3 is a block diagram illustrating the inductor current sensing device according to aspects of the present disclosure.

FIG. 3 shows a block diagram of the inductor current sensing device 300. The sensing device 300 includes a LS current sensing circuit 310, a slope sensing circuit 320, a valley current sensing circuit 330, an operator circuit 340, a current slope synthesis circuit 350, and a buffer driver 360. The LS current sensing circuit 310 receives the drain-to-source voltage $v_{DS}$ from the LS switch and converts it into a signal $I_{SS}$. The signal $I_{SS}$ includes information of the current slope (e.g., deriving from $\Delta v_{DS}/\Delta t$) and the minimum current value (e.g., deriving from the minimum voltage of the drain-to-source voltage $v_{DS}$). Next, the signal $I_{SS}$ from the LS current sensing circuit 310 is supplied to the slope sensing circuit 320 and the valley current sensing circuit 330.

In the slope sensing circuit 320, the current slope information in the signal $I_{SS}$ is converted into a constant current slope information. In one embodiment, the slope sensing circuit 320 includes a sample and hold circuit (not shown) to generate a constant DC information of the LS current slope ($I_{LS\_SLP}$). The valley current sensing circuit 330 converts the minimum current value in the signal $I_{SS}$ into the valley current information. In one embodiment, the valley current sensing circuit 330 includes a sample and hold circuit (not shown) to generate a constant DC information of the LS valley current ($I_{S\_VALLEY}$).

The operator circuit 340 receives the LS current slope information $I_{LS\_SLP}$ from the slope sensing circuit 320, the input voltage $V_{IN}$ and output voltage $V_{OUT}$ as inputs. Based on these inputs, the operator circuit 340 is configured to calculate the HS current slope information according to the relationship between the HS current slope and LS current slope as shown in Equation (2) below.

$$\frac{\Delta i_{L\_RISE}}{\Delta i_{L\_FALL}} = \frac{V_{IN} - V_{OUT}}{V_{OUT}} \quad (2)$$
$$= \frac{V_{IN}}{V_{OUT}} - 1$$

The Equation (2) can be converted to Equation (3) below for the operator circuit 340 to calculate the HS current slope information $$\Delta i_{L\_RISE} = \Delta i_{L\_FALL} \cdot \frac{V_{IN}}{V_{OUT}} - \Delta i_{L\_FALL} \quad (3)$$

where $\Delta i_{L\_FALL}$ and $\Delta i_{L\_RISE}$ can be respectively replaced by the LS current slope information $I_{LS\_SLP}$ the HS current slope information $I_{HS\_SLP}$. Thus, the HS current slope information $I_{HS\_SLP}$ can be obtained by multiplying the LS current slope information $I_{LS\_SLP}$ with ($V_{IN}/V_{OUT}$) and then subtracting the LS current slope information $I_{LS\_SLP}$. In one embodiment, the operator circuit 340 includes circuit (e.g., operational amplifiers) to perform the mathematical operations of multiplying the LS current slope information $I_{LS\_SLP}$ with ($V_{IN}/V_{OUT}$) and being subtracted by the LS current slope information $I_{LS\_SLP}$. In another embodiment, the operator circuit 340 is configured to perform the mathematical operation of multiplying the LS current slope information $I_{LS\_SLP}$ with ($V_{IN}/V_{OUT}$). A subtractor circuit 342, separated from the operator circuit 340, is configured to perform the operation of subtracting the LS current slope information $I_{LS\_SLP}$ from the output of the operator circuit 340.

Once the LS current slope information $I_{LS\_SLP}$ and the HS current slope information $I_{HS\_SLP}$ are acquired, the current slope synthesis circuit 350 integrates the information according to the PWM signal and generates a synthesis signal $i_{SLP}$. The synthesis signal $i_{SLP}$ is a triangular waveform including a rising slope when the PWM signal is in HIGH state and a falling sloe when the PWM signal is in LOW state. The rising slope is based on the HS current slope information $I_{HS\_SLP}$ and the falling slope is based on the LS current slope information $I_{LS\_SLP}$. The rising and failing slopes of the synthesis signal $i_{SLP}$ are proportional to the rising and falling slopes of the inductor current $I_L$ as shown in Equation (4) below.

$$\Delta i_{SLP} = \frac{1}{K1} \cdot \frac{1}{K2} \cdot R_{DS\_ON} \cdot \Delta i_L \quad (4)$$

where (1/K1) is a conversion gain of the LS current sensing circuit 310 and (1/K2) is a conversion gain of the current slope synthesis circuit 350. It is noted that the valley current information $I_{S\_VALLEY}$ also has the same conversion gain as shown in Equation (5) below.

$$I_{S\_VALLEY} = \frac{1}{K1} \cdot \frac{1}{K2} \cdot R_{DS\_ON} \cdot i_{L\_VALLEY} \quad (5)$$

A summation circuit 352 combines the synthesis signal $i_{SLP}$ from the current slope synthesis circuit 350 and the valley current information $I_{S\_VALLEY}$ from the valley current sensing circuit 330, and generates a combined signal. The combined signal is then driven by the buffer driver 360, which outputs a signal $I_{MON}$ as shown in Equation (6) below. The signal $I_{MON}$ can be input to the switch controller that controls turn-ons and turn-off of the HS and LS switches.

$$v_{MON} = R_{MON} \cdot I_{MON} = \qquad (6)$$
$$R_{MON} \cdot (I_{S\_VALLEY} + \Delta i_{SLP}) = \frac{R_{MON} \cdot R_{DS\_ON}}{K1 \cdot K2} \cdot (i_{L\_VALLEY} + \Delta i_L)$$

According to Equation (6), the signal $I_{MON}$ may represent the inductor current $I_L$ of the inductor L1. In one embodiment, the buffer driver 360 may convert the signal $I_{MON}$ into a voltage signal $V_{MON}$ by multiplying a resistance ($R_{MON}$). In this embodiment, the output waveforms can be generated according to the equations below. When (0<t<DT), $$v_{MON}(t)_n = v_{S\_VALLEY_{(n-1)}} + \frac{\Delta v_{MON}(pwm=H)_{(n-1)}}{\Delta t} \cdot DT \qquad (7a)$$

When (DT<t<T), $$v_{MON}(t)_n = v_{S\_VALLEY_{(n-1)}} + \qquad (7b)$$
$$\frac{\Delta v_{MON}(pwm=H)_{(n-1)}}{\Delta t} \cdot DT - \frac{\Delta v_{MON}(pwm=L)_{(n-1)}}{\Delta t} \cdot t$$

where PWM=H means that the PWM signal is in HIGH state (i.e., 0<t<DT), PWM=L means that the PWM signal is in LOW state (i.e., DT<t<T), the valley current information $v_{S\_VALLEY}$ used is the previous(n−1) information of the valley current information and the slope information Δvmon used is the previous(n−1) slope information. The present(n) vmon information is calculated from the previous(n−1) vs_valley and the previous(n−1) Δvmon.

Figure 4:
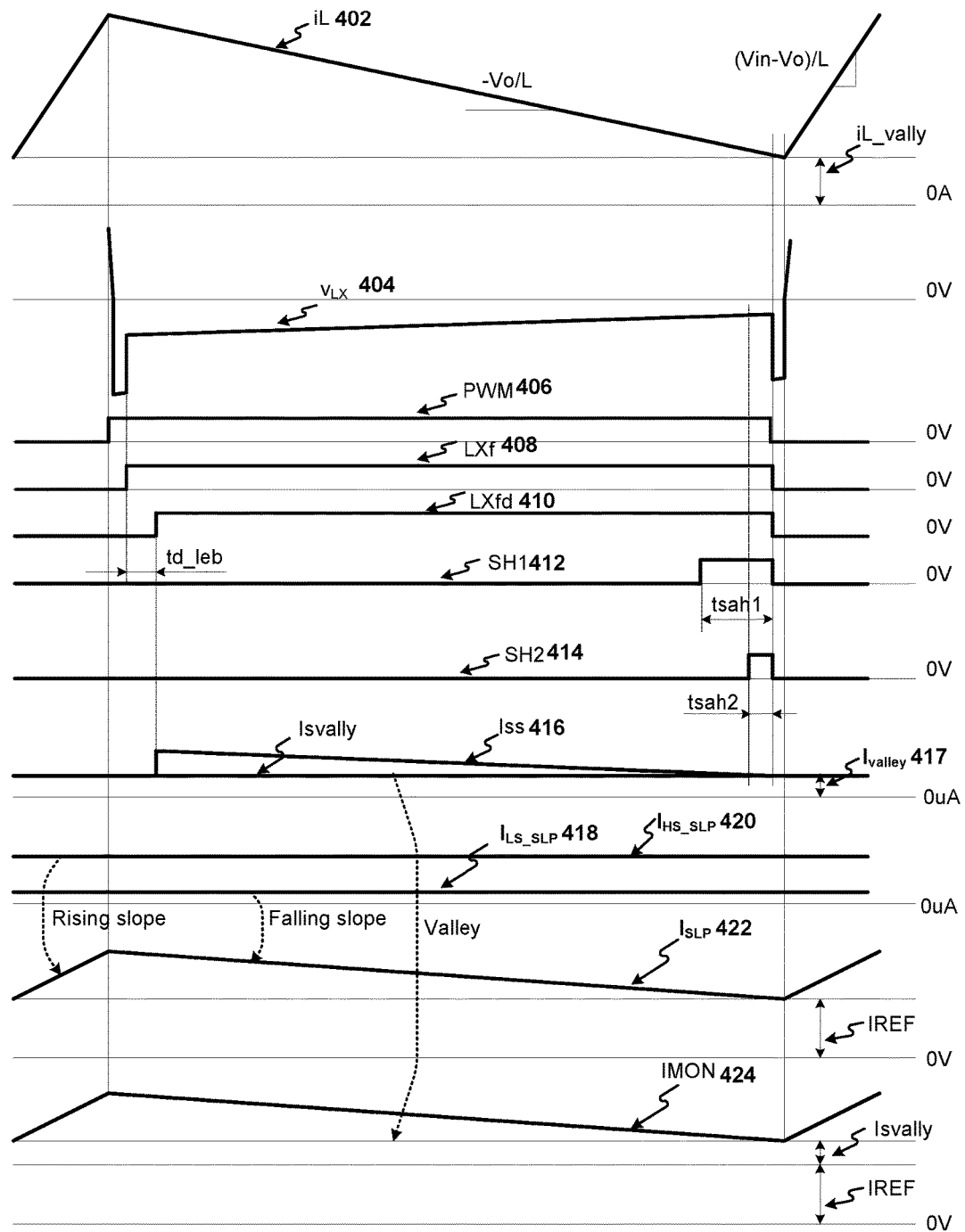
FIG. 4 is a graph depicting signal waveforms in the sensing device of FIG. 3.

FIG. 4 shows signal waveforms for the signals in the inductor current sensing device 300 of FIG. 3. The signal 402 is a waveform of the inductor current ($i_L$) in the DC-DC converter of FIG. 2. Signal 404 is the LX node voltage signal ($v_{LX}$). The big drop-outs in signal 404 during the rising and falling edge of the PWM signal 406 are caused by the LS diode (D2) forward operation during dead-time, which turns off both HS and LS switches. Signal 406 is the PWM signal controlling the HS and LS switches. Signal 408 is the signal (LXf) indicating the turn-on period of the LS switch. Signal 410 is the signal (LXfd) indicating the sensing period, which excludes the leading edge blanking time(td_leb) from the signal LXf. Signal 412 and signal 414 are the triggering signals (i.e., SH1 and SH2 in FIG. 3) of the corresponding sample and hold circuits in the slope sensing circuit 320 and the valley current sensing circuit 330. Signal 416 is the signal ($I_{SS}$) generated from the LS current sensing circuit 310 when the signal 410 (LXfd) is HIGH. The falling slope information ($I_{LS-SLP}$), and the valley current information ($I_{S\_VALLEY}$) can be derived from the signal 416 ($I_{SS}$). The falling slope information ($I_{LS-SLP}$) as shown in waveform 418 and the valley current information 417 ($I_{S\_VALLEY}$) are sampled and held respectively when the corresponding triggering signal (412 and 414) turns on. The sample and hold operation is usually occurred as late as possible in the end of the PWM period to get accurate information.

The rising slope information ($I_{HS-SLP}$) as shown signal 420 is calculated according to the falling slope information ($I_{LS-SLP}$) and the input and output voltages ($V_{IN}$ and $V_{OUT}$) as discussed above in connection with the operator circuit 340. As shown, the signal 418 (i.e., the falling slope information $I_{LS-SLP}$) and the signal 420 (i.e., the rising slope information $I_{RS-SLP}$) are constant DC currents. The signals 418 and 420 are combined via the current slope synthesis circuit 350, which combines the information according to the PWM signal 406 and generates a synthesis signal 422 ($i_{SLP}$). The synthesis signal 422 ($i_{SLP}$) is a triangular waveform including a rising slope when the PWM signal 406 is in HIGH state and a falling sloe when the PWM signal is in LOW state. The rising slope is based on the HS current slope information 420 ($I_{RS\_SLP}$) and the falling slope is based on the LS current slope information 418 ($I_{LS\_SLP}$). In one embodiment, triangular waveform ($i_{SLP}$) may be shifted by a known DC offset ($I_{REF}$). Signal 424 is the final waveform ($I_{MON}$) that includes the signal 422 ($i_{SLP}$) and the valley current information ($I_{S-VALLEY}$). Since the signal $I_{MON}$ may represent the inductor current $i_L$ of the inductor L1, the inductor current $I_L$ can be obtained, e.g., using equation (6) and iL=iL_valley+ΔiL, which may be seen from FIG. 1(b).

Current Slope Sensing Method/Device

Figure 5A:
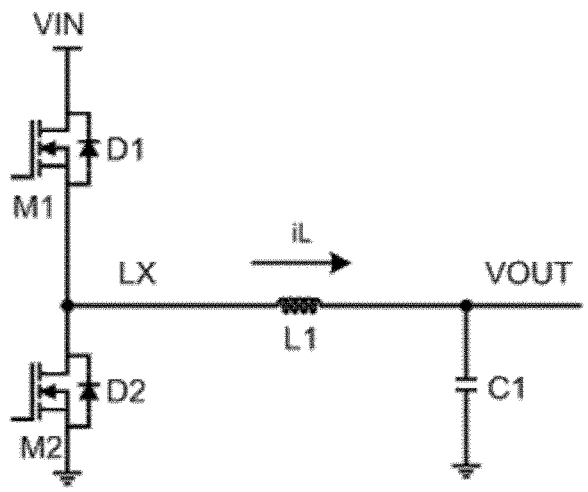
FIG. 5(a) is a schematic diagram illustrating a conventional SNIPS.
Figure 5B:
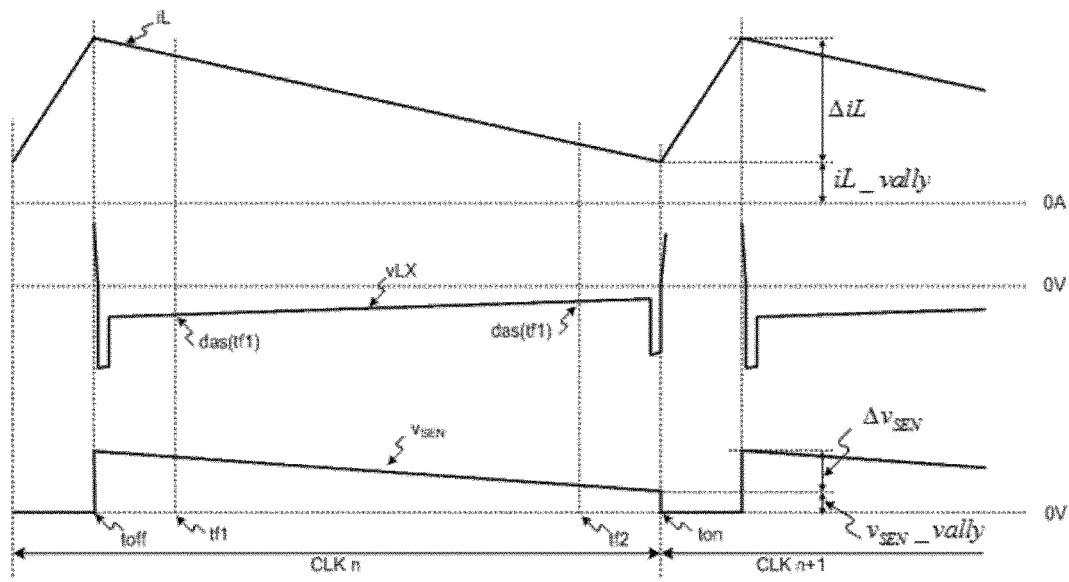
FIG. 5(b) is a graph depicting signal waveforms in the SNIPS of FIG. 5(a) with a conventional inductor current slope sensing device of FIG. 5(c).
Figure 5C:
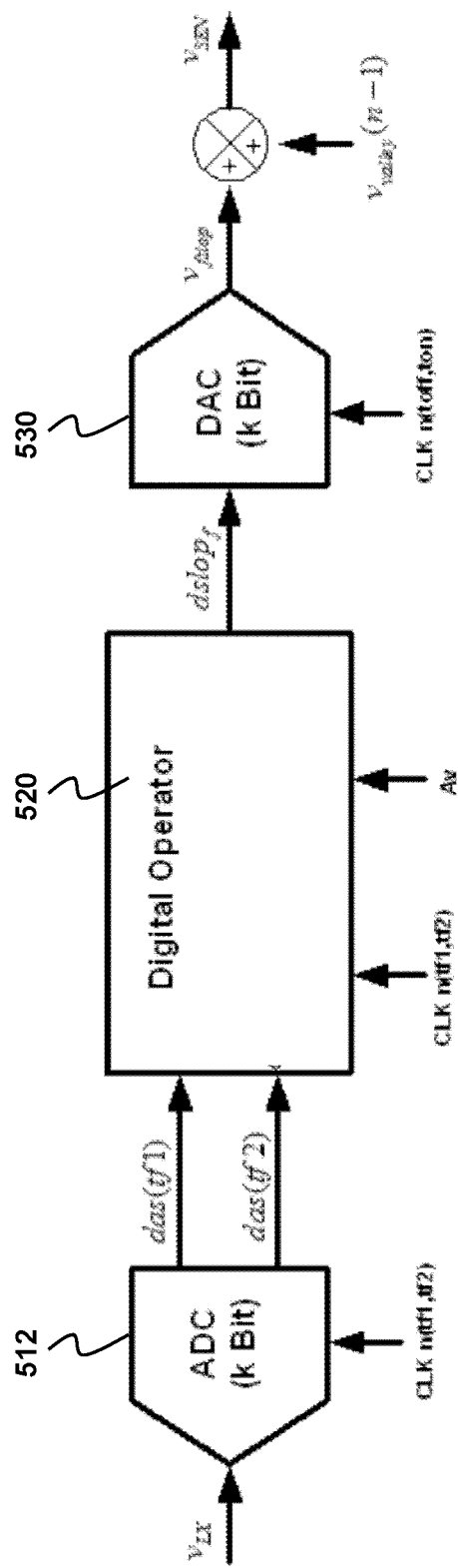
FIG. 5(c) is a block diagram illustrating a conventional inductor current slope sensing device.

An inductor current sensing device, such as the sensing device 300 of FIG. 3, usually requires to sense the current slope. With respect to slope sensing, the conventional method for a DC-DC converter (e.g., a step-down DC-DC converter 500 as shown in FIG. 5(a)) employs Analog-to-Digital converter (ADC) and Digital-to-Analog converter (DAC). Voltage $v_{LX}$ as shown in FIG. 5(b) are the voltage at the LX node when the LS switch (M2) is turned on. It is noted that there are two dead time periods during which diodes (D1 and D2) are operated and prevent the cross conduction when the HS switch (M1) and LS switch (M2) are in transition periods. Excluding the diode operation periods, the slope of the voltage $v_{LX}$ is proportional to the inductor current slope. As such, the conventional current sensing device/method 510 as shown in FIG. 5(c) uses an ADC 512, a digital operator 520 and a DAC 530 to sense the current slope based on voltage $v_{LX}$. However, using ADC and DAC in a current sensing device would increase the overall design and cost because these components are relatively expensive and require a large amount of real estate on the device.

Figure 6A:
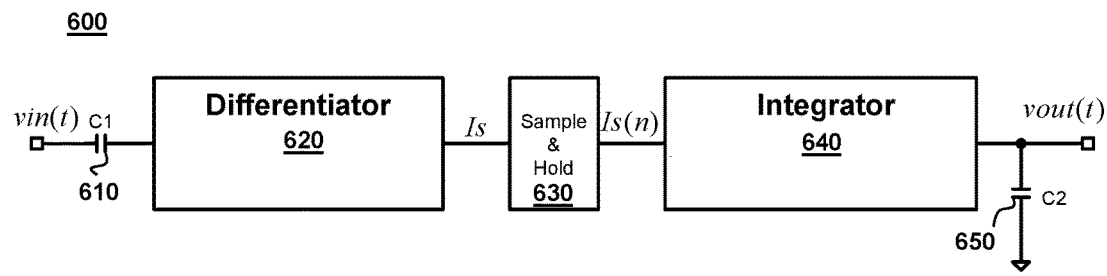
FIG. 6(a) is a block diagram of an inductor current slope sensing device according to aspects of the present disclosure.
Figure 6B:
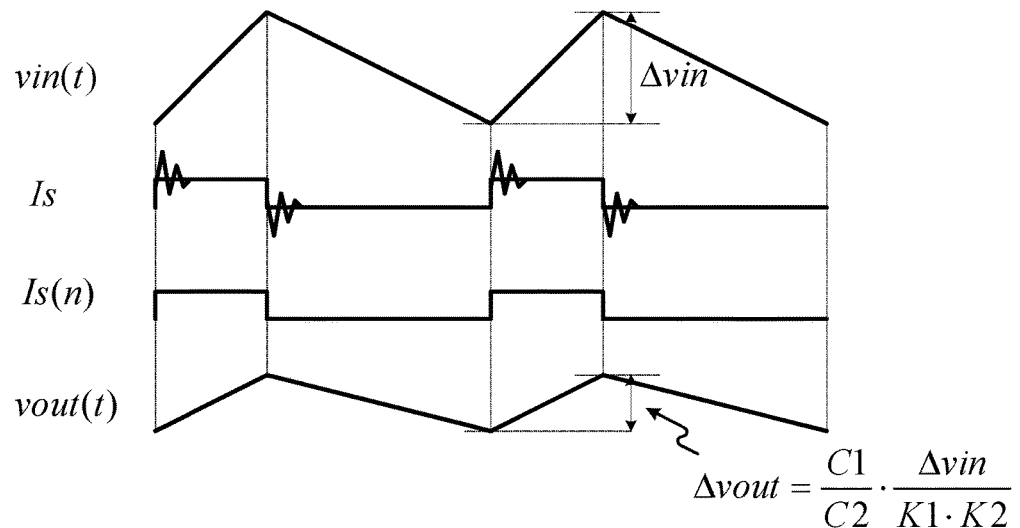
FIG. 6(b) is a graph depicting signal waveform in the inductor current slope sensing device of FIG. 6(a).

According to aspects of the present disclosure, FIGS. 6(a) and 6(b) depict a slope sensing device for sensing the slope of an input signal and providing an output signal proportional to the input signal with a predetermined gain via capacitors. The slope sensing device according to aspects of the present disclosure comprises a differentiator configured to differentiate the input signal by using a first capacitor, a sample and hold circuit configured to convert the differentiated signal into a constant DC slope information and an integrator configured to generate an output signal having a waveform proportional to the waveform of the input signal by using a second capacitor. Aspects of the present disclosure in connection with FIGS. 6(a) and 6(b) may be implemented in the inductor current sensing device 300 of FIG. 3, especially the LS current sensing circuit 310, the slope sensing circuit 320, and a current slope synthesis circuit 350.

FIG. 6(a) shows a block diagram of the current slope sensing device 600 which includes a capacitor 610, a differentiator 620, a sample and hold circuit 630, an integrator 640 and a capacitor 650. FIG. 6(b) are signal waveforms for the signals in the current slope sensing device 600 of FIG. 6(a).

The input voltage signal $v_{in}(t)$ to the current slope sensing device 600 is the dropout voltage as Equation (8) below.

$$V_{in}(t) = i_L \times R_{DS\text{-}ON} \qquad (8)$$

where $I_L$ is the target inductor current and $R_{DS\text{-}ON}$ is the turn-on resistance of the corresponding switch. In the example of a DC-DC converter of FIG. 2, the input voltage to a current slope sensing device 600 can be voltage $v_{LX}$ at the phase node, and the $R_{DS\text{-}ON}$ in Equation (8) can be the turn-on resistance of the LS switch (M2).

The input signal $v_{in}(t)$ is first differentiated by capacitor 610 in the differentiator 620 and multiplied by K1 of the first stage gain. As such, the linear voltage slope is converted into a DC current value ($I_S$) in the differentiator 620 according to the equation below.

$$I_S = C1 \cdot \frac{1}{K1} \cdot \frac{\Delta vin}{\Delta t} \qquad (9)$$

Figure 9A:
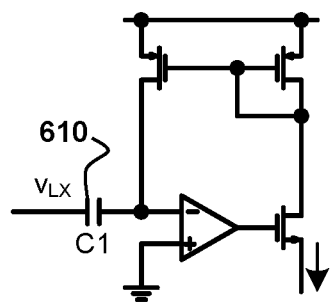
FIGS. 9(a) and 9(b) are schematic diagrams illustrating a differentiator employed in an inductor current slope sensing device of FIG. 6(a).
Figure 9B:
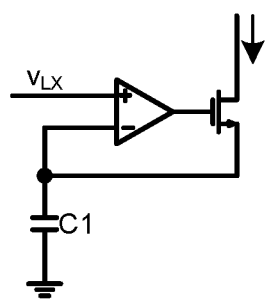

FIG. 9(a) shows an example of a differentiator 620 showing the capacitor 610. The differentiator 900a of FIG. 9(a) is a falling voltage slope sensing differentiator where the input voltage (e.g., voltage $v_{LX}$) to the current slope sensing device 600 has a leading edge sawtooth waveform in its falling slope. FIG. 9(b) is a rising voltage slope sensing differentiator where the input voltage to the slope sensing device 600 has a tailing edge sawtooth waveform in its rising slope.

The differentiator 620 generated a current $I_S$ as shown in FIG. 6(b). The generated current $I_S$ has noise at transition periods. A sample and hold circuit 630 is then employed to acquire a steady state slope information $I_S(n)$ as shown in FIG. 6(b). In the sample and hold circuit 630, the signal $I_S$ is sampled and held as the nth information of the steady state slope information $I_S(n)$. The nth slope information $I_S(n)$ is then integrated by capacitor 650 and multiplied by 1/K2 of the second stage gain in the integrator 640. As such, the DC current slope information $I_S(n)$ is converted into the voltage signal according to the equations below.

$$\Delta vout = \frac{1}{C2} \cdot \frac{1}{K2} \cdot \int I_S(n) \cdot dt \qquad (10)$$

With Equation (9), Equation (10) can be converted to the equation below.

$$\Delta vout = \frac{1}{C2} \cdot \frac{1}{K2} \cdot \int C1 \cdot \frac{1}{K1} \cdot \frac{\Delta vin}{\Delta t} \Delta t = \frac{C1}{C2} \cdot \frac{\Delta vin}{K1 \cdot K2} \qquad (11)$$

where when C1=C2, $\Delta vout=\Delta vin/(K1 \times K2)$. Accordingly, the output voltage slope is proportional to the input voltage slope with the predetermined gain $1/(K1 \times K2)$. In one embodiment, the output voltage $v_{out}(t)$ may be converted into the current information, e.g., by a transconductance amplifier, resistance amplifier, or resistor, and be level-shifted by the previously sensed valley information (i.e., the (n−1)th valley information) with a certain reference voltage.

Figure 7A:
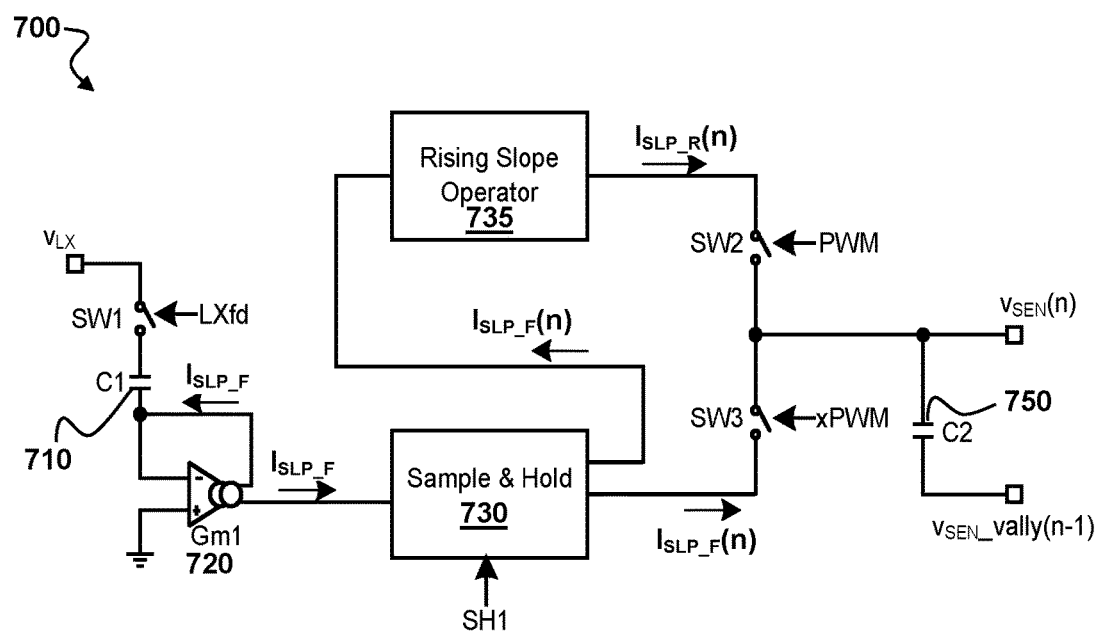
FIG. 7(a) is a schematic diagram illustrating an inductor current slope sensing device used in a SNIPS system according to aspects of the present disclosure.
Figure 7B:
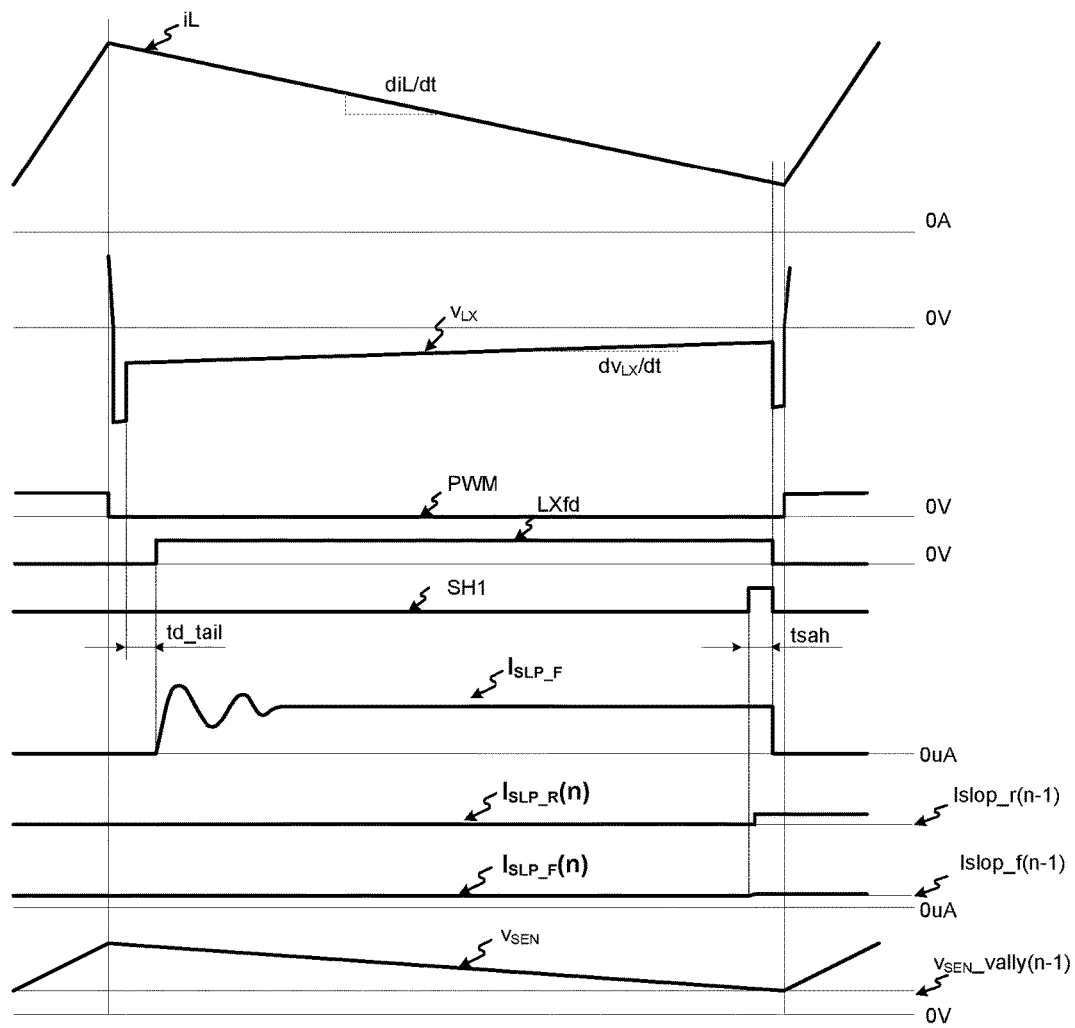
FIG. 7(b) is a graph depicting signal waveforms in the inductor current slope sensing device of FIG. 7(a).

FIG. 7(a) shows an example of the current sloping sensing device 700 implemented in an inductor current sensing device such as the device 300 in a SMPS system, such as system 200 of FIG. 2 for sensing inductor current in a SMPS (e.g. a step down DC-DC converter). FIG. 7(b) are signal waveforms for the signals in the current sloping sensing device 700.

Input voltage $v_{LX}$ is the voltage at the phase(or LX) node of a step down DC-DC converter. The input voltage $v_{LX}$ is differentiated by a differentiator, which includes a capacitor 710 and the transconductance amplifier 720 with a gain, 1/K1. Switch SW1 is controlled by a signal LXfd indicating the sensing period. The sensing period equals the turn-on period of the LS switch excluding a leading edge blanking time. The switch SW1 is turned on when signal LXfd turns HIGH (i.e., the period when the inductor current is falling). When voltage $v_{LX}$ starts falling with a constant slope, the capacitor 710 begins to charge with a current for the amplifier 720. As shown in FIG. 7(a), the amplifier 720 regulates its inverting input voltage to be the same as its non-inverting input voltage which is connected to the ground. The charging current of the capacitor 710 would reach to a constant DC current level in a stead state. The linear voltage slope is converted into the DC current slope value $I_{SLP\_F}$ in the differentiator 720 as the equation below.

$$I_{SLP\_F} = C1 \cdot \frac{1}{K1} \cdot \frac{\Delta v_{LX}}{\Delta t} \qquad (12)$$

The current slope information $I_{SLP\_F}$ is then sampled and held in the sample and hold circuit 730 and converted to current slope information $I_{SLP\_F}(n)$ during the nth period. It is a constant value as shown in FIG. 7(b). The current slope information $I_{SLP\_F}(n)$ is applied to a rising slope operator circuit 735 which has a gain, A2. In the rising slope operator circuit 735, the rising current slope is calculated based on the falling current slope information $I_{SLP\_F}(n)$ according to Equation (13).

$$I_{SLP\_R} = (A2-1) \cdot I_{SLP\_F} = C1 \cdot \frac{1}{K1} \cdot (A2-1) \cdot \frac{\Delta v_{LX}}{\Delta t} \qquad (13)$$

With the information of the falling current slope $I_{SLP\_F}(n)$ and the rising current slope $I_{SLP\_R}(n)$, the switches SW2 and SW3 controlled by a PWM signal can help integrate the information with the capacitor 750. In one example, when the PWM signal is HIGH, switch SW2 is turned on and switch SW3 is off. In this period, the capacitor 750 is charged by the rising current slope $I_{SLP\_N}(n)$. The voltage $V_{SEN\_R}(n)$ is obtained according to the equation below.

$$\Delta v_{SEN\_R}(n) = \frac{1}{C2} \cdot \int I_{SLP\_R}(n) \cdot dt = (A2-1) \cdot \Delta v_{SEN\_F}(n) \qquad (14)$$

When the PWM signal is LOW, switch SW2 is turned off and switch SW3 is on. In this period, the capacitor 750 is discharged by the falling current slope $I_{SLP\_F}(n)$. The voltage $V_{SEN\_F}(n)$ is obtained according to the equation below.

$$\Delta v_{SEN\_F}(n) = \frac{1}{C2} \cdot \int I_{SLP\_F}(n) \cdot dt \qquad (15)$$

With the valley voltage information $V_{SEN\_VALLEY}$ sensed from voltage $v_{LX}$, the final output voltage $v_{SEN}(n)$ can be obtained according to Equations 16a and 16b.

When the PWM signal is in LOW state: (if (A2−1)=1/K2)

$$v_{SEN}(n)(t) = v_{SEN\_VALLEY}(n-1) + \frac{C1}{C2} \cdot \frac{1}{K1} \cdot \frac{1}{K2} \cdot \Delta vin \cdot t \quad (16a)$$

When the PWM signal is in HIGH state:

$$v_{SEN}(n)(t) = \quad (16b)$$
$$v_{SEN\_VALLEY}(n-1) + \frac{C1}{C2} \cdot \frac{1}{K1} \cdot \frac{1}{K2} \cdot \Delta vin \cdot DT - \frac{C1}{C2} \cdot \frac{1}{K1} \cdot \Delta vin \cdot t$$

where $V_{SEN\_VALLEY}(n-1)$ is the (n−1)th valley voltage information sensed from voltage $v_{LX}$, DT is the same as the turn-on period of the HS switch. The output voltage slopes are proportional to corresponding slopes of the inductor current iL with the predetermined gain (1/(K1×K2)). As shown in FIG. 7(b), the output voltage $v_{SEN}(n)(t)$ is proportional to the inductor current iL. Thus, the output voltage $v_{SEN}(n)(t)$ can represent the inductor current $i_L$.

Figure 8:
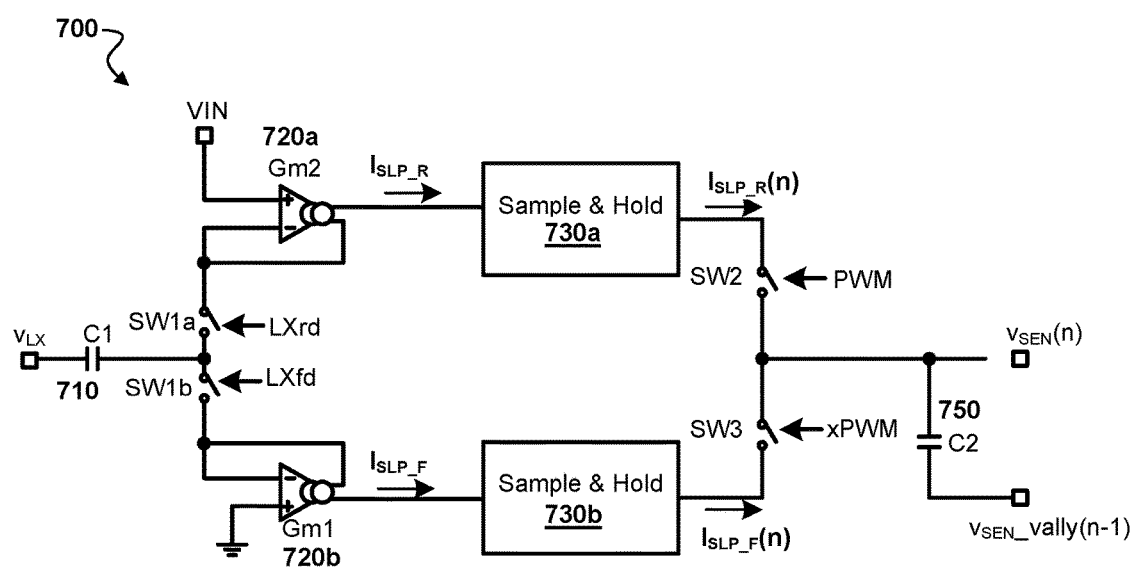
FIG. 8 is a schematic diagram illustrating an inductor current slope sensing device used in a SMPS system according to aspects of the present disclosure.

FIG. 8 shows another example of the current slope sensing device 800 implemented in a SMPS system, such as system 200 of FIG. 2 for sensing inductor current in a SMPS (e.g. a step down DC-DC converter). In FIG. 7, the current slope sensing device 700 calculates HS rising current slope based on the sensed LS falling current slope, and then obtain the inductor current information by combining the HS and LS current slope and the valley current information independently. Unlike the device 700 of FIG. 7, the current slope sensing device 800 is configured to sense LS falling current slope information as well as HS rising current slope information, and integrate the sensed information to obtain the inductor current information. Since the portions of device 800 for sensing LS falling current slope is similar to the current slope device 700 of FIG. 7, the detailed description regarding the components for sensing LS falling current slope information is not repeated here for simplicity.

With respect to HS rising current slope, switch SW1a is controlled by a signal LXrd indicating the sensing period for the rising current slope. The sensing period equals the turn-on period of the HS switch excluding a tailing edge blanking time. The switch SW1a is turned on when signal LXfd turns HIGH (i.e., the period when the inductor current is rising). The rising input voltage $v_{LX}$ is differentiated by a differentiator, which includes a capacitor 710 and the transconductance amplifier 720a, and is converted into the DC current slope value $I_{SLP\_R}$. The current slope information $I_{SLP\_R}$ is then sampled and held in the sample and hold circuit 730a and converted to current slope information $I_{SLP\_R}(n)$ during the nth period. In this embodiment, since a sensing device is employed to sense the HS slope information, a rising slope operator which acquires HS slope information based on the LS slope information is not needed. With the information of the falling current slope $I_{SLP\_F}(n)$, the rising current slope $I_{SLP\_R}(n)$ and the valley voltage information $V_{SEN\_VALLEY}$ sensed from voltage $v_{LX}$, the switches SW2 and SW3 controlled by a PWM signal can help integrate the information with the capacitor 750 and generate the output voltage $v_{SEN}(n)$ as described in connection to FIG. 7.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6

What is claimed is:

1. A Switch Mode Power Supply (SMPS) system, comprising:
   a SMPS, comprising a high-side (HS) switch and a low-side (LS) switch coupled in series and an output filter including an inductor and a capacitor coupled to a switch node formed by the HS and LS switches, wherein an inductor current is supplied by the inductor to a load; and
   an inductor current sensing device coupled across the LS switch, the inductor current sensing device having a first input configured to receive a node signal indicating a voltage level at the switch node, a second input configured to receive an input voltage $V_{IN}$ of the system and a third input configured to receive an output voltage $V_{OUT}$ of the system, wherein the inductor current sensing device is configured to obtain a first constant DC slope information, a second constant DC slope information and a valley current information based on the first input, second and third inputs, and generate an output signal based on the first constant DC slope information, the second constant DC slope information and the valley current information, wherein the output signal has a triangular waveform including a rising slope and a falling slope proportional to rising and falling slopes of the inductor current.

2. The system of claim 1, wherein the inductor current sensing device includes:
   a current sensing circuit configured to generate a sensed current based on the node signal, wherein the sensed current includes a first current slope and a minimum current value,
   a slope sensing circuit coupled to the current sensing circuit, the slope sensing circuit having a first input configured to receive the sensed current from the current sensing circuit, wherein the slope sensing circuit is configured to convert the first current slope in the sensed current into the first constant DC slope information;
   an operator circuit coupled to the slope sensing circuit, the operator circuit having a first input configured to receive the first constant DC slope information from the slope sensing circuit, a second input configured to receive the input voltage $V_{IN}$ and a third input to receive the output voltage $V_{OUT}$, wherein the operator circuit is configured to generate the second constant DC slope information based on the first, second and third inputs; and a current slope synthesis circuit coupled to the operator circuit and the slope sensing circuit, the current slope synthesis circuit having a first input configured to receive the first constant DC slope information, a second input configured to receive the second constant DC slope information and a third input configured to receive a control signal, wherein the current slope synthesis circuit is configured to generate a synthesis signal by integrating the first and second constant DC slope information according to the control signal, wherein the synthesis signal has a triangular waveform including a rising slope when the control signal is in a first state and a falling slope when the control signal is in a second state opposite to the first state, wherein the rising and falling slopes of the synthesis signal are respectively proportional to rising and falling slopes of the inductor current.

3. The system of claim 2, further comprising a valley current sensing circuit coupled to the current sensing circuit, the valley current sensing circuit having a first input configured to receive the sensed current from the current sensing circuit, wherein the valley current sensing circuit is configured to convert the minimum current value in the sensed current into the valley current information.

4. The system of claim 3, wherein the slope sensing circuit and valley current sensing circuit each has a sample and hold circuit.

5. The system of claim 2, further comprising a summation circuit coupled to the current slope synthesis circuit and the valley current sensing circuit, wherein the summation circuit is configured to generate a combined signal by combining the synthesis signal and the valley current information.

6. The system of claim 5, further comprising a buffer driver coupled to the summation circuit, wherein the buffer driver is configured to drive the combined signal from the summation circuit and generate the output signal.

7. The system of claim 2, wherein the operator circuit is configured to generate the second constant DC slope information by multiplying the first constant DC slope information with $((V_{IN}-V_{OUT})/V_{OUT})$.

8. An inductor current sensing device for detecting an inductor current in a Switch Mode Power Supply (SMPS), wherein the SMPS has a high-side (HS) switch and a low-side (LS) switch coupled in series and an output filter including an inductor and a capacitor coupled to a switch node formed by the HS and LS switches, wherein an inductor current is supplied by the inductor to a load, the inductor current sensing device comprising:
a current sensing circuit coupled across the LS switch, the current sensing circuit configured to sense a current across the LS switch and generate a sensed current, wherein the sensed current includes a first current slope and a minimum current value,
a slope sensing circuit coupled to the current sensing circuit, the slope sensing circuit having a first input configured to receive the sensed current from the current sensing circuit, wherein the slope sensing circuit is configured to convert the first current slope in the sensed current into a first constant DC slope information;
an operator circuit coupled to the slope sensing circuit, the operator circuit having a first input configured to receive the first constant DC slope information from the slope sensing circuit, a second input configured to receive an input voltage $V_{IN}$ of the SMPS and a third input to receive an output voltage $V_{OUT}$ of the SMPS, wherein the operator circuit is configured to generate a second constant DC slope information based on the first, second and third inputs; and
a current slope synthesis circuit coupled to the operator circuit and the slope sensing circuit, the current slope synthesis circuit having a first input configured to receive the first constant DC slope information, a second input configured to receive the second constant DC slope information and a third input configured to receive a control signal, wherein the current slope synthesis circuit is configured to generate a synthesis signal by integrating the first and second constant DC slope information according to the control signal, wherein the synthesis signal has a triangular waveform including a rising slope when the control signal is in a first state and a falling slope when the control signal is in a second state opposite to the first state, wherein the rising and falling slopes of the synthesis signal are respectively proportional to rising and falling slopes of the inductor current.

9. The device of claim 8, further comprising a valley current sensing circuit coupled to the current sensing circuit, the valley current sensing circuit having a first input configured to receive the sensed current from the current sensing circuit, wherein the valley current sensing circuit is configured to convert the minimum current value in the sensed current into the valley current information.

10. The device of claim 9, wherein the slope sensing circuit and valley current sensing circuit each has a sample and hold circuit.

11. The device of claim 9, further comprising a summation circuit coupled to the current slope synthesis circuit and the valley current sensing circuit, wherein the summation circuit is configured to generate a combined signal by combining the synthesis signal and the valley current information.

12. The device of claim 11, further comprising a buffer driver coupled to the summation circuit, wherein the buffer driver is configured to drive the combined signal form the summation circuit and generate an output signal, wherein the output signal has a triangular waveform including a rising slope and a falling slope proportional to the rising and falling slopes of the inductor current.

13. The system of claim 8, wherein the operator circuit is configured to generate the second constant DC slope information by multiplying the first constant DC slope information with $((V_{IN}-V_{OUT})/V_{OUT})$.

14. A method for sensing an inductor current in a Switch Mode Power Supply (SMPS), wherein the SMPS has a high-side (HS) switch and a low-side (LS) switch coupled in series and an output filter including an inductor and a capacitor coupled to a switch node formed by the HS and LS switches, wherein an inductor current is supplied by the inductor to a load, the method comprising:
generating a sensed current by sensing a current across the LS switch, wherein the sensed current includes a first current slope and a minimum current value;
converting the first current slope in the sensed current into a first constant DC slope information;
generating a second constant DC slope information based on the first constant DC slope information, an input voltage $V_{IN}$ of the SMPS and an output voltage $V_{OUT}$ of the SNIPS; and
generating a synthesis signal by integrating the first and second constant DC slope information according to a control signal, wherein the synthesis signal has a triangular waveform including a rising slope when the control signal is in a first state and a falling slope when the control signal is in a second state opposite to the first state, wherein the rising and falling slopes of the synthesis signal are respectively proportional to rising and falling slopes of the inductor current.

15. The method of claim 14, further comprising converting the minimum current value in the sensed current into the valley current information.

16. The method of claim 15, wherein converting the minimum current value in the sensed current into the valley current information includes sampling and held the minimum current value according to a triggering signal.

17. The method of claim 14, wherein converting the first current slope in the sensed current into the first constant DC slope information includes sampling and held the first current slope according to a triggering signal.

18. The method of claim 15, further comprising generating a combined signal by combining the synthesis signal and the valley current information.

19. The method of claim 14, wherein generating the second constant DC slope information includes multiplying the first constant DC slope information with $((V_{IN}-V_{OUT})/V_{OUT})$.

20. A slope sensing device for sensing a slope of an input signal and providing an output signal proportional to the input signal, the slope sensing device comprising:
a differentiator having an input configured to receive an input signal having a triangular waveform with at least one slope, wherein the differentiator is configured to generate a differentiated signal by differentiating the input signal using a first capacitor and;
a sample and hold circuit having a first input configured to receive the differentiated signal and a second input to receive a triggering signal, wherein the sample and hold circuit is configured to convert the differentiated signal into a constant DC slope information by sampling and held the differentiated signal when the triggering signal is on; and
an integrator having an input configured to receive the constant DC slope information, wherein the integrator is configured to generate an output signal having a waveform proportional to the waveform of the input signal by using a second capacitor.

21. The device of claim 20, wherein the differentiator includes a transconductance amplifier.

22. The device of claim 20, wherein the integrator is configured to generate an output signal by charging or discharging the second capacitor according to the constant DC slope information.

23. The device of claim 20, further comprising an operator circuit coupled to the sample and hold circuit, the operator circuit is configured to generate a second constant DC slope information based on the constant DC slope information.

24. The device of claim 23, wherein the integrator has a second input configured to receive the second constant DC slope, wherein the integrator is configured to generate the output signal by using the second capacitor to integrate the constant DC slope information and second constant DC slope information.

25. The device of claim 24, wherein the integrator includes two switches controlled by a control signal, wherein a first switch is turned on and a second switch is turned off when the control signal is in a first state, wherein the first switch is turned off and the second switch is turned on when the control signal is in a second state opposite to the first state, wherein the second capacitor is discharged according to the constant DC slope information when the control signal is in the first state, and the second capacitor is charged according to the second constant DC slope according to the second constant DC slope information when the control signal is in the second state.

26. The device of claim 20, further comprising a second differentiator to generate a second differentiated signal using the first capacitor, and a second sample and hold circuit to convert the second differentiated signal into a second constant DC slope information.

27. The device of claim 26, wherein the integrator has a second input configured to receive the second constant DC slope, wherein the integrator is configured to generate the output signal by using the second capacitor to integrate the constant DC slope information and second constant DC slope information.

28. The device of claim 27 wherein the integrator includes two switches controlled by a control signal, wherein a first switch is turned on and a second switch is turned off when the control signal is in a first state, wherein the first switch is turned off and the second switch is turned on when the control signal is in a second state opposite to the first state, wherein the second capacitor is discharged according to the constant DC slope information when the control signal is in the first state, and the second capacitor is charged according to the second constant DC slope according to the second constant DC slope information when the control signal is in the second state.

29. A method for sensing a slope of an input signal and providing an output signal proportional to the input signal, the method comprising:
differentiating an input signal having a triangular waveform with at least one slope by using a first capacitor to generate a differentiated signal;
converting the differentiated signal into a constant DC slope information by sampling and held the differentiated signal when a triggering signal is on;
generating an output signal by using a second capacitor to integrate the constant DC slope information, wherein the output signal having a waveform proportional to the waveform of the input signal.

30. The method of claim 29, wherein generating the output signal includes charging or discharging the second capacitor according to the constant DC slope.

31. The method of claim 29, further comprising generating a second constant DC slope information based on the constant DC slope information.

32. The method of claim 31, wherein generating the output signal by using the second capacitor includes discharging the second capacitor according to the constant DC slope information when a control signal is in a first state, and charging the second capacitor according to the second constant DC slope information when the control signal is in a second state opposite to the first state.

33. The method of claim 29, further comprising generating a second differentiated signal using the first capacitor, and converting the second differentiated signal into a second constant DC slope information.

34. The method of claim 33, wherein generating the output signal using the second capacitor includes discharging the second capacitor according to the constant DC slope information when a control signal is in a first state, and charging the second capacitor according to the second constant DC slope information when the control signal is in a second state opposite to the first state.

* * * * *